(12) United States Patent
Deo

(10) Patent No.: US 9,819,313 B2
(45) Date of Patent: Nov. 14, 2017

(54) ENVELOPE DETECTORS WITH HIGH INPUT IMPEDANCE

(71) Applicant: ANALOG DEVICES, INC., Norwood, MA (US)

(72) Inventor: Sukhijinder S. Deo, Wilsonville, OR (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/006,898

(22) Filed: Jan. 26, 2016

(65) Prior Publication Data
US 2017/0214367 A1  Jul. 27, 2017

(51) Int. Cl.
H03F 3/45 (2006.01)
H03F 1/02 (2006.01)
H03G 3/00 (2006.01)

(52) U.S. Cl.
CPC ....... H03F 1/0233 (2013.01); H03F 3/45174 (2013.01); H03F 3/45273 (2013.01); H03G 3/004 (2013.01); *H03F 2200/102* (2013.01); *H03F 2200/105* (2013.01)

(58) Field of Classification Search
CPC .......................................... H03F 3/45
USPC ................................. 330/257, 260
See application file for complete search history.

(56) References Cited

U.S. PATENT DOCUMENTS

| | | | | |
|---|---|---|---|---|
| 6,172,549 B1 | 1/2001 | Gilbert | | |
| 7,170,348 B2* | 1/2007 | Nishimura | .......... | H03F 3/45183 330/253 |
| 7,772,537 B2* | 8/2010 | Boemler | ................ | H04N 3/155 250/214 A |
| 8,674,768 B2* | 3/2014 | Dally | ................... | H03G 3/3036 330/278 |
| 8,866,553 B2* | 10/2014 | Botker | ...................... | H03F 1/14 330/260 |
| 9,030,258 B2* | 5/2015 | Duan | ..................... | H02H 9/043 330/253 |

FOREIGN PATENT DOCUMENTS

EP  1385174 B1  7/2006
WO  WO 2015/048645  4/2015

OTHER PUBLICATIONS

Ahmet Oncu et al., *Millimeter-Wave CMOS Impulse Radio*, Hiroshima University, The University of Tokyo, Japan, www.intechopen.com, ISBN 978-953-307-086-5, © Apr. 2010, 35 pages.

* cited by examiner

*Primary Examiner* — Henry Choe
(74) *Attorney, Agent, or Firm* — Patent Capital Group

(57) ABSTRACT

Disclosed herein are envelope detectors with high input impedance, and related methods and systems. In some embodiments, an envelope detector with high input impedance may include: a swinging stage including first, second, and third transistors, wherein the third transistor and an active transistor are arranged as a differential pair, the first transistor is the active transistor when an input to the envelope detector is positive, and the second transistor is the active transistor when the input to the envelope detector is negative; and a feedback circuit, coupled to the swinging stage, to provide an output signal representative of a rectification of the input.

20 Claims, 6 Drawing Sheets

ENVELOPE DETECTORS WITH HIGH INPUT IMPEDANCE

TECHNICAL FIELD

This disclosure relates generally to electronic devices, and more particularly, to envelope detectors.

BACKGROUND

The "envelope" of a signal may refer to the varying amplitude of a sinusoidal or otherwise periodic signal, as known in the art. Varying amplitude signals are commonly used in a number of settings, such as digital communication systems employing advanced modulation schemes such as code division multiple access (CDMA), Global System for Mobile Communications Long Term Evolution (GSM-LTE), and quadrature amplitude modulation (QAM) (e.g., in microwave point-to-point communication systems).

BRIEF DESCRIPTION OF THE DRAWINGS

Embodiments will be readily understood by the following detailed description in conjunction with the accompanying drawings. Embodiments are illustrated by way of example, and not by way of limitation, in the figures of the accompanying drawings.

DETAILED DESCRIPTION

Figure 1:
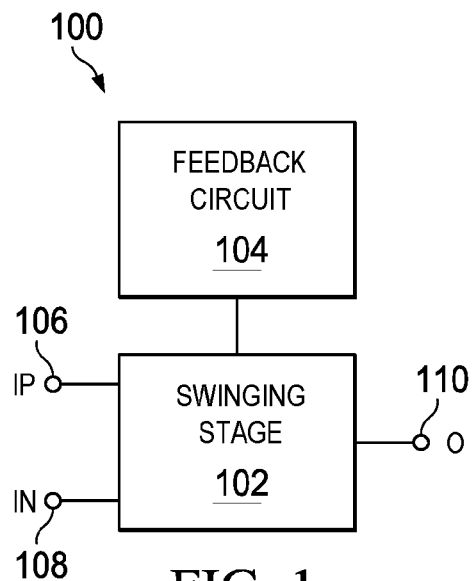
FIG. 1 is a block diagram of an envelope detector, in accordance with various embodiments.

Disclosed herein are envelope detectors with high input impedance, and related methods and systems. In some embodiments, an envelope detector with high input impedance may include: a swinging stage including first, second, and third transistors, wherein the third transistor and an active transistor are arranged as a differential pair, the first transistor is the active transistor when an input to the envelope detector is positive, and the second transistor is the active transistor when the input to the envelope detector is negative; and a feedback circuit, coupled to the swinging stage, to provide an output signal representative of a rectification of the input.

As noted above, varying amplitude signals are commonly used in digital communication systems. Other settings for amplitude modulation include audio/visual equipment, electrical instrumentation, medical electronics, and personal or large-scale computers, for example. Typically, an envelope detector is used as part of a larger circuit to measure the power of an incoming signal (e.g., by measuring the voltage and calculating a power). Once the envelope of an incoming signal is accurately detected, the envelope may be further processed to extract other statistical information about the signal, such as its root-mean-square value, its peak value, etc.

Conventional envelope detection has taken a number of forms. Conventional half-wave rectifiers may include a diode junction (e.g., a PN junction or a Schottky diode), along with a resistor and capacitor load. The diode in such half-wave rectifiers may be biased at a particular current chosen as a trade-off between a desired frequency response and a desired sensitivity. Conventional full-wave rectifiers (e.g., using four Schottky diodes) may improve on conventional half-wave rectifiers by presenting a balanced load to the positive and negative signal swing, and providing a doubled output (due to the wave rectification). The output of a conventional full-wave rectifier is often further processed using a precision amplifier, and the diodes of the full-wave rectifier may be biased in view of a frequency response/sensitivity trade-off. Conventional active absolute value cells typically include a nonlinear transconductance stage whose output current is balanced with the output of a similar replica cell. The absolute value cell may be driven by an error amplifier to null the difference between the outputs of the two cells.

These conventional envelope detection architectures typically have a moderate input impedance in the range of 100-500Ω (depending upon the nominal operating bias of the rectifying junction, selected in view of bandwidth requirements, as discussed below). Additionally, in these architectures, the input signal to be detected is applied across a series combination of a rectifying diode and a resistor (and also typically includes a parallel capacitor). The detector load is thus dynamic, changing with the signal level.

These characteristics present difficulties when these conventional envelope detectors are connected across the main signal chain. In particular, the low impedance of these envelope detectors may load the driving circuit block. A conventional "workaround" is to put a shunt resistor across the envelope detector to stabilize its input impedance across different signal levels to a controlled value (e.g., 50Ω), and then to use a coupler or resistive divider to couple the signal into the envelope detector. This approach degrades the effective sensitivity of the envelope detector because the signal that the envelope detector sees is often reduced by 20 dB or more from the sensing point level along the signal chain. Additionally, couplers consume a lot of space in an integrated circuit, making their use impractical for integrated solutions. To combat the reduction in effective sensitivity, some approaches further include an additional buffer amplifier, which both takes up space and consumes power.

Various ones of the embodiments disclosed herein may present one or more advantages over the conventional envelope detectors. For example, various ones of the envelope detectors disclosed herein may present a high input impedance, and as such, can be connected directly across the signal chain (e.g., in parallel to the main signal flow connections) without consuming excessive signal power. In some embodiments, an envelope detector 100 may provide several kilohms of input resistance, which may enable the envelope detector 100 to "hang off" any desired point in a signal chain without appreciable loading effects (e.g., as discussed below with reference to FIG. 7). Consequently, the use of the envelope detectors 100 disclosed herein may help maintain desirable (or required, depending on the application) high linearity of the signal chain in a device. By contrast, conventional diode detectors may present an input impedance of a few hundred ohms, and may be strongly nonlinear (depending on the signal level), making it difficult to maintain signal path integrity. Moreover, the envelope detectors 100 disclosed herein may be linear-in-volts detectors, with the detected envelope proportional to the envelope of the input signal. In some applications, linear-in-volts detectors may advantageously avoid the square law nonlinearity of diode-based detectors.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

FIG. 1 is a block diagram of an envelope detector 100, in accordance with various embodiments. The envelope detector 100 may include a swinging stage 102 and a feedback circuit 104. The input to the envelope detector 100 may be a differential input signal, and in such embodiments, the envelope detector 100 may include a positive input terminal 106 and a negative input terminal 108 coupled to the swinging stage 102. In some embodiments, the input to the envelope detector 100 may be a single-ended signal, and the envelope detector 100 may include a single-ended-to-differential converter (not shown) to provide a differential input signal to the positive input terminal 106 and the negative input terminal 108. The envelope detector 100 may have an output terminal 110.

The swinging stage 102 may respond to positive-to-negative transitions in the input differential signal by "swinging" from positive to negative amplification components in the swinging stage 102, and vice versa. The feedback circuit 104 may help regulate the amplification performed by the swinging stage 102 so that the output signal appearing at the output terminal 110 represents a rectification of the input signal at the positive input terminal 106 and the negative input terminal 108. The common-mode voltage at the positive input terminal 106/negative input terminal 108 may serve as the reference voltage at the output terminal 110. For example, if the common-mode voltage at the input terminals 106 and 108 is 1.5 V, a voltage of 1.5 V at the output terminal 110 may represent a "no signal" condition.

Figure 2:
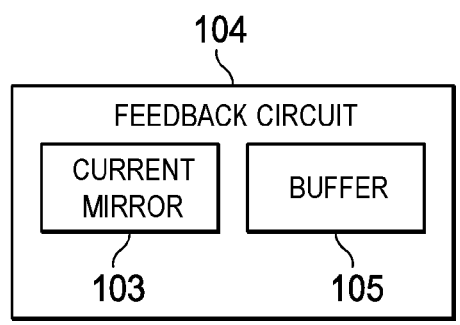
FIG. 2 is a block diagram of a feedback circuit that may be included in the envelope detector of FIG. 1, in accordance with various embodiments.

A number of embodiments of the swinging stage 102 and the feedback circuit 104 are disclosed herein. For example, FIG. 2 is a block diagram of a feedback circuit 104 that may be included in the envelope detector 100, in accordance with various embodiments. The feedback circuit 104 may include a current mirror 103 and a buffer 105. The current mirror 103 may balance current to the swinging stage 102, and the buffer 105 may complete the feedback loop to the swinging stage 102.

Figure 3:
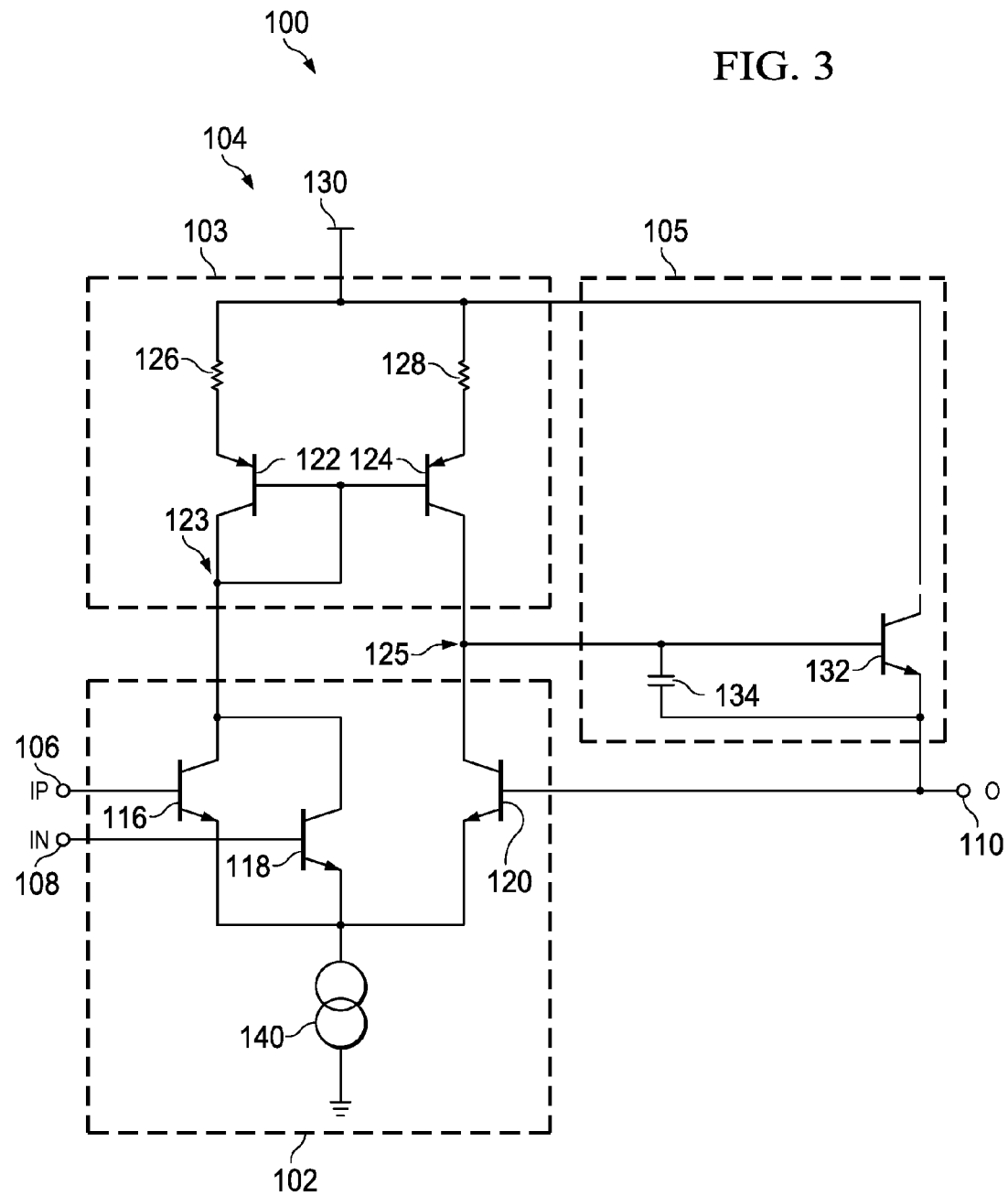
FIG. 3 is a schematic illustration of an embodiment of the envelope detector of FIG. 1 including an embodiment of the feedback circuit of FIG. 2.

FIG. 3 is a schematic illustration of an embodiment of the envelope detector 100 including an embodiment of the feedback circuit 104 of FIG. 2. In particular, the envelope detector 100 of FIG. 3 includes a swinging stage 102 and a feedback circuit 104, and the feedback circuit 104 includes a current mirror 103 and a buffer 105. Although the transistors illustrated in FIG. 3 are bipolar junction transistors (BJTs) of certain polarities (e.g., NPN or PNP), the envelope detector 100 of FIG. 3 (and the other envelope detectors 100 disclosed herein) may be implemented using complementary metal oxide semiconductor (CMOS) transistors instead of BJTs, as known in the art. For example, NPN BJTs may be replaced with NMOS transistors, and PNP BJTs may be replaced with PMOS transistors. The components of the envelope detector 100 of FIG. 3 are now discussed in detail.

The current mirror 103 may include a first resistor 126 and a first transistor 122 in a first branch 123, and a second resistor 128 and a second transistor 124 in a second branch 125. The transistor 122 may be diode connected, and the bases of the transistors 122 and 124 may be coupled together. The current mirror 103 may be coupled between a supply voltage 130 and the swinging stage 102.

The buffer 105 may be coupled to the collector of the transistor 124 of the current mirror 103, and in particular may include an emitter-follower transistor 132 whose base is coupled to the collector of the transistor 124. The emitter of the transistor 132 may be coupled to the base of the transistor 120 (and thus the output terminal 110), as shown. The transistor 132 may not have a standing bias current, and thus, as discussed below, the emitter of the transistor 132 may track the voltages input to the positive input terminal 106 and the negative input terminal 108 when these voltages are positive. A compensation capacitor 134 may be connected across the base and the emitter of the transistor 132 and may provide a high-frequency path to drive the base of the transistor 120, as discussed below. In some embodiments, a value of 300 pF may be suitable for the compensation capacitor 134. In various embodiments, the buffer 105 may include components other than those illustrated in FIG. 3, as appropriate.

The swinging stage 102 of FIG. 3 may include a first transistor 116, a second transistor 118, and a third transistor 120. The transistors 116, 118, and 120 may be arranged in a common emitter configuration, and the emitters of these transistors may be coupled to a current source 140, as shown. The base of the transistor 116 may be coupled to the positive input terminal 106, and the base of the transistor 118 may be coupled to the negative input terminal 108. In some embodiments, the differential signal applied to the positive input terminal 106 and the negative input terminal 108 may have a common-mode value of approximately one-half of the value of the supply voltage 130. In some embodiments, the input signal may be DC coupled to the positive input terminal 106 and the negative input terminal 108 (such that both AC and DC values pass to the positive input terminal 106 and the negative input terminal 108). In other embodiments, the input signal may be AC coupled to the positive input terminal 106 and the negative input terminal 108 (e.g., when a capacitor is used to filter out any DC signal prior to the positive input terminal 106 and the negative input terminal 108), in which case an appropriate bias voltage may be applied to the bases of the transistors 116 and 118 through suitable resistors, as known in the art.

The collectors of the transistors 116 and 118 may be tied together and coupled to the first branch 123 of the current mirror 103, and the collector of the transistor 120 may be coupled to the second branch 125 of the current mirror 103. The base of the transistor 120 may be coupled to the output terminal 110 and, as discussed below, may be driven by a feedback loop working through the current mirror 103 and the buffer 105.

When the voltage at the positive input terminal 106 is substantially higher than the voltage at the negative input terminal 108 (e.g., during the first half of a sinusoidal cycle), the transistor 116 may conduct more heavily than the transistor 118. In such a phase of operation, the transistor 116 may be referred to as the "active" transistor, the transistor 118 may be effectively "shut off," and the transistor 116 and the transistor 120 may function as a differential pair. The voltage at the base of the transistor 120, and therefore at the output terminal 110, may track the voltage at the positive input terminal 106. When the voltage at the negative input terminal 108 is substantially higher than the voltage at the positive input terminal 106 (e.g., during the second half of a sinusoidal cycle), the transistor 118 may conduct more heavily than the transistor 116. In this phase of operation, the transistor 118 may be the active transistor, the transistor 116 may be effectively "shut off," and the transistor 118 and the transistor 120 may function as a differential pair. The voltage at the base of the transistor 120, and therefore at the output terminal 110, may track the voltage at the negative input terminal 108. Consequently, the voltage appearing at the output terminal 110 may represent a full-wave rectification of the voltage applied across the positive input terminal 106 and the negative input terminal 108 as a result of the feedback circuit 104 and the gain of the differential pair in the swinging stage 102.

As discussed above, the swinging stage 102 may swing between different "positive" and "negative" phases of operation. When the amplitude of the input signal is large enough that one of the transistors 116 or 118 conducts significantly more than the other, the behavior of the swinging stage 102 may be well modeled as switching back and forth between two differential pairs within the common-emitter triplet of transistors 116, 118, and 120. When the amplitude of the input signal is small, the transistors 116 and 118 may be conducting simultaneously, and the first branch 123 of the current mirror 103 may be providing collector currents for both of the transistors 116 and 118. One consequence of the simultaneous conduction is that a DC offset may be introduced in the voltage at the output terminal 110, relative to the common-mode voltage at the input. Additionally, since the output currents of the transistors 116 and 118 may be out of phase for small input signals, the sum of these signals may result in a small net signal current going into the transistor 122 of the current mirror 103.

Figure 4:
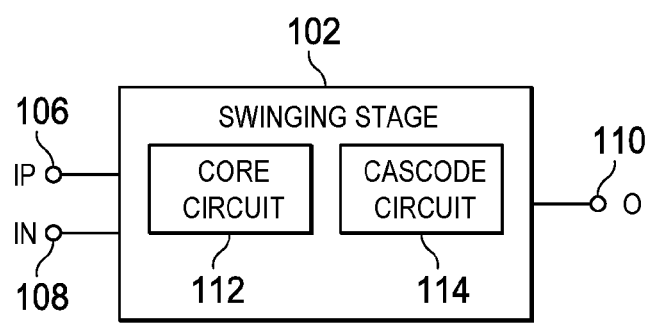
FIG. 4 is a block diagram of a swinging stage that may be included in the envelope detector of FIG. 1, in accordance with various embodiments.

Some embodiments of the swinging stage 102 disclosed herein may be arranged to mitigate these "small signal" consequences. For example, FIG. 4 is a block diagram of a swinging stage 102 that includes a core circuit 112 and a cascode circuit 114, in accordance with various embodiments. The core circuit 112 may take the form of the swinging stage 102 illustrated in FIG. 3, while the cascode circuit 114 may be disposed between the core circuit 112 and the feedback circuit 104 to strengthen the positive and negative swinging of the swinging stage 102.

Figure 5:
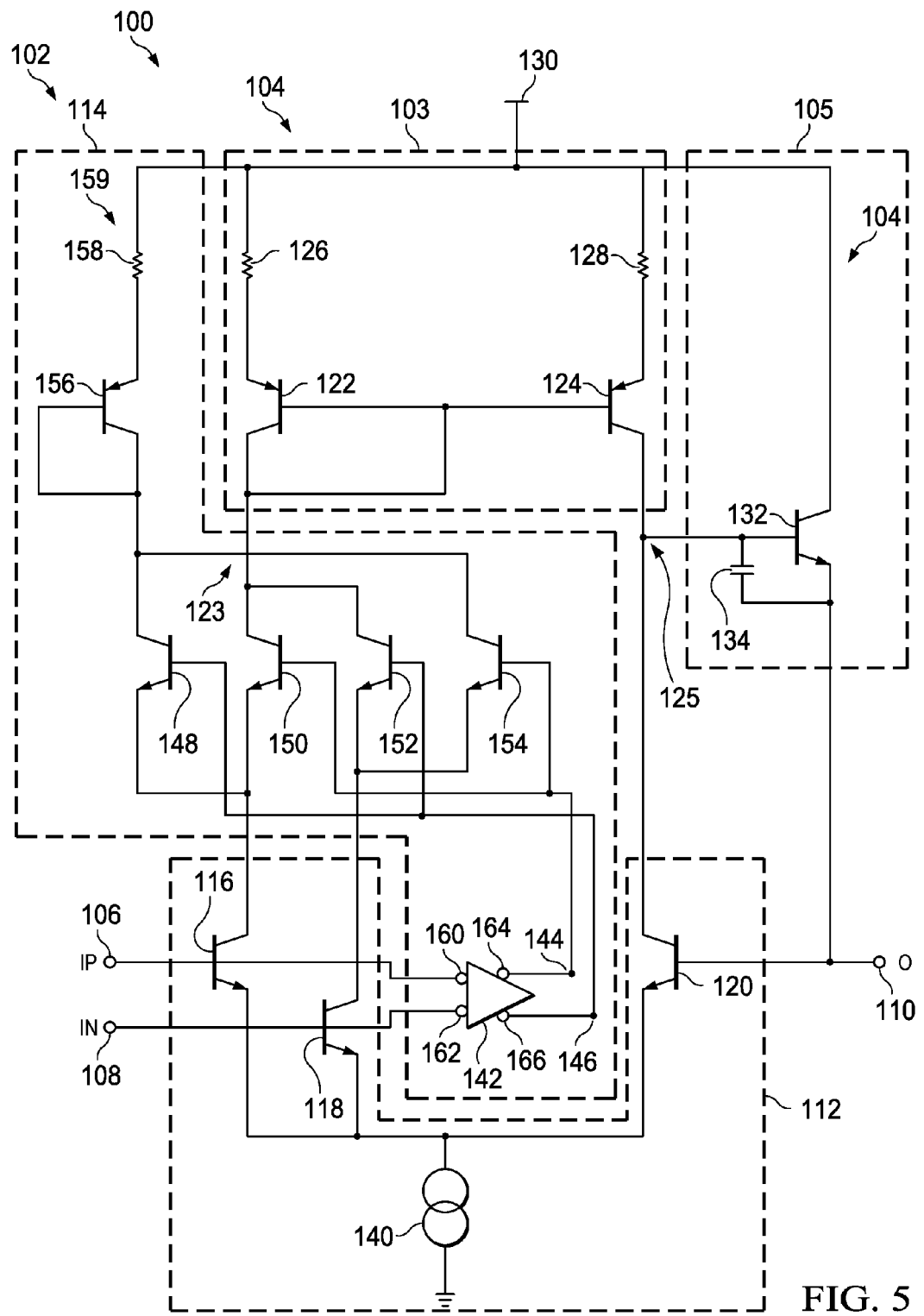
FIG. 5 is a schematic illustration of an embodiment of the envelope detector of FIG. 1 including an embodiment of the feedback circuit of FIG. 2 and an embodiment of the swinging stage of FIG. 4.

FIG. 5 is a schematic illustration of an embodiment of the envelope detector 100 including an embodiment of the feedback circuit 104 of FIG. 2 and an embodiment of the swinging stage 102 of FIG. 4. In particular, the envelope detector 100 of FIG. 5 includes a swinging stage 102 and a feedback circuit 104, the swinging stage 102 includes a core circuit 112 and a cascode circuit 114, and the feedback circuit 104 includes a current mirror 103 and a buffer 105. The current mirror 103 of FIG. 5 may take the form of the current mirror discussed above with reference to FIG. 3, while the buffer 105 of FIG. 5 may include an emitter-follower transistor 132 and a compensation capacitor 134, as discussed above with reference to FIG. 3. As discussed above with reference to FIG. 3, the transistor 132 may not have a standing bias current, and thus the emitter of the transistor 132 may track the voltages input to the positive input terminal 106 and the negative input terminal 108 when these voltages are positive.

As noted above, the core circuit 112 of the swinging stage 102 of FIG. 5 may take the form of the swinging stage 102 of FIG. 3, and may include a first transistor 116, a second transistor 118, and a third transistor 120. These transistors may be arranged substantially in accordance with any of the embodiments discussed above. The cascode circuit 114 of FIG. 5 may include four cascode transistors 148, 150, 152, and 154. The collector of the transistor 116 (of the core circuit 112) may be coupled to the emitters of the cascode transistors 148 and 150, and the collector of the transistor 118 (of the core circuit 112) may be coupled to the emitters of the cascode transistors 152 and 154. The bases of the transistors 116 and 118 (coupled to the positive input terminal 106 and the negative input terminal 108, respectively) may be coupled to a first input terminal 160 and a second input terminal 162, respectively, of a limiting amplifier 142. Although a single limiting amplifier 142 is illustrated in FIG. 5, the limiting amplifier 142 may be implemented as multiple separate amplifiers, as desired. The limiting amplifier 142 may include a first output terminal 164 and a second output terminal 166 for providing amplified versions of the signals appearing at the first input terminal 160 and the second input terminal 162, respectively. The nodes 144 and 146 illustrated in FIG. 5 represent the voltages at the first output terminal 164 and the second output terminal 166, respectively, of the limiting amplifier 142. The first output terminal 164 may be coupled to the bases of the cascode transistors 150 and 154, and the second output terminal 166 may be coupled to the bases of the cascode transistors 148 and 152, as shown. The first input terminal 160 and the first output terminal 164 may be in-phase, while the second input terminal 162 and the second output terminal 166 may be in-phase.

The gain of the limiting amplifier 142 may be selected so that the output swing of the limiting amplifier 142 is adequate to "activate" or "deactivate" different ones of the cascode transistors as the input signal swings positive and negative. In some embodiments, for example, the output swing may be approximately +/−200 mV; in other embodiments, for example, the output swing may be approximately +/−300 mV. The speed of the limiting amplifier 142 may be selected so as to introduce an acceptable amount of phase lag at its output terminals 164 and 166 relative to the signal current out of the collectors of the transistors 116 and 118. In some embodiments, the acceptable amount of phase lag may be 10°, for example, but this will depend on the application. The speed of the limiting amplifier 142 may be balanced against the power consumption of the limiting amplifier 142, with higher speeds typically requiring higher power consumption.

The collectors of the cascode transistors 150 and 152 may be tied together and coupled to the first branch 123 of the current mirror 103, and the collectors of the cascode transistors 148 and 154 may be tied together and coupled to a replica branch 159. The replica branch 159 may include a resistor 158 and a diode-connected transistor 156 selected to provide a replica of the resistor 126 and the transistor 122, respectively, of the first branch 123 (and thus may mimic the voltage drop across the combination of the resistor 126 and the transistor 122). As shown in FIG. 5, the differential drive for the bases of the cascode transistors is arranged such that, of the two cascodes coupled to each branch of the current mirror 103, the one coupled to the transistor 122 has its base pulled high when the input signal swings positive on the corresponding core circuit transistor (either transistor 116 or transistor 118).

The collector of the transistor 120 (of the core circuit 112) may be coupled to the second branch 125 of the current mirror 103. The base of the transistor 120 may be coupled to the output terminal 110 and, as discussed herein, may be driven by a feedback loop working through the current mirror 103 and the buffer 105.

When the limiting amplifier 142 has a high enough gain that the cascode transistors of the cascode circuit 114 are fully switched as the input signal swings from positive to negative (or from negative to positive), then only the signal current generated by the transistors 116 and 118 during the positive input swing at their respective bases will be routed to the transistor 122 of the current mirror 103. For example, during the positive half cycle of a sinusoidal input, when the voltage at the positive input terminal 106 is greater than the voltage at the negative input terminal 108, the voltage at the node 144 may be more than the voltage at the node 146 by a large enough amount (e.g., 200-300 mV) to cause both of the cascode transistors 148 and 152 to shut down while the cascode transistors 150 and 154 are conducting. The cascode transistor 150 may transport the current from the collector of the positive-swinging transistor 116 to the transistor 122, while the cascode transistor 154 may transport the current from the collector of the negative swinging transistor 118 to the supply voltage 130 (via the transistor 156). During the negative half cycle of a sinusoidal input, when the voltage at the negative input terminal 108 is greater than the voltage at the positive input terminal 106, the voltage at the node 146 may be more than the voltage at the node 144 by a large enough amount (e.g., 200-300 mV) to cause both of the cascode transistors 150 and 154 to shut down while the cascode transistors 148 and 152 are conducting. The cascode transistor 152 may transport the current from the collector of the positive-swinging transistor 118 to the transistor 122, while the cascode transistor 148 may transport the current from the collector of the negative-swinging transistor 116 to the supply voltage 130 (via the transistor 156). Consequently, the transistor 122 may only receive signal current from the positive-swinging one of the transistors 116 and 118, and the feedback loop provided by the feedback circuit 104 may ensure that the voltage at the output terminal 110 is a true full-wave rectification of the input signal.

Embodiments of the envelope detector 100 that include a cascode circuit 114 may improve the sensitivity of the detector because the out of phase current from the negative-swinging one of the transistors 116 and 118 (which, as discussed above, may reduce the net current into the transistor 122 in the embodiment illustrated in FIG. 3) does not get routed to the transistor 122. The cascode circuit 114 may also mitigate or eliminate the DC offset introduced when the transistors 116 and 118 simultaneously conduct because only half of the combined currents of the transistors 116 and 118 is routed to the transistor 122 (and is balanced against the same current from the transistor 120). In some embodiments, a sensitivity level of −35 dBm or greater may be achieved. The greatest sensitivities may be achieved when the physical properties of various ones of the devices in the envelope detector 100 are well matched (e.g., the transistors 116 and 118 have the same dimensions, saturation current, etc.) and laid out to minimize device offsets. Trimming techniques, for example, may be performed to improve device matching.

Figure 6:
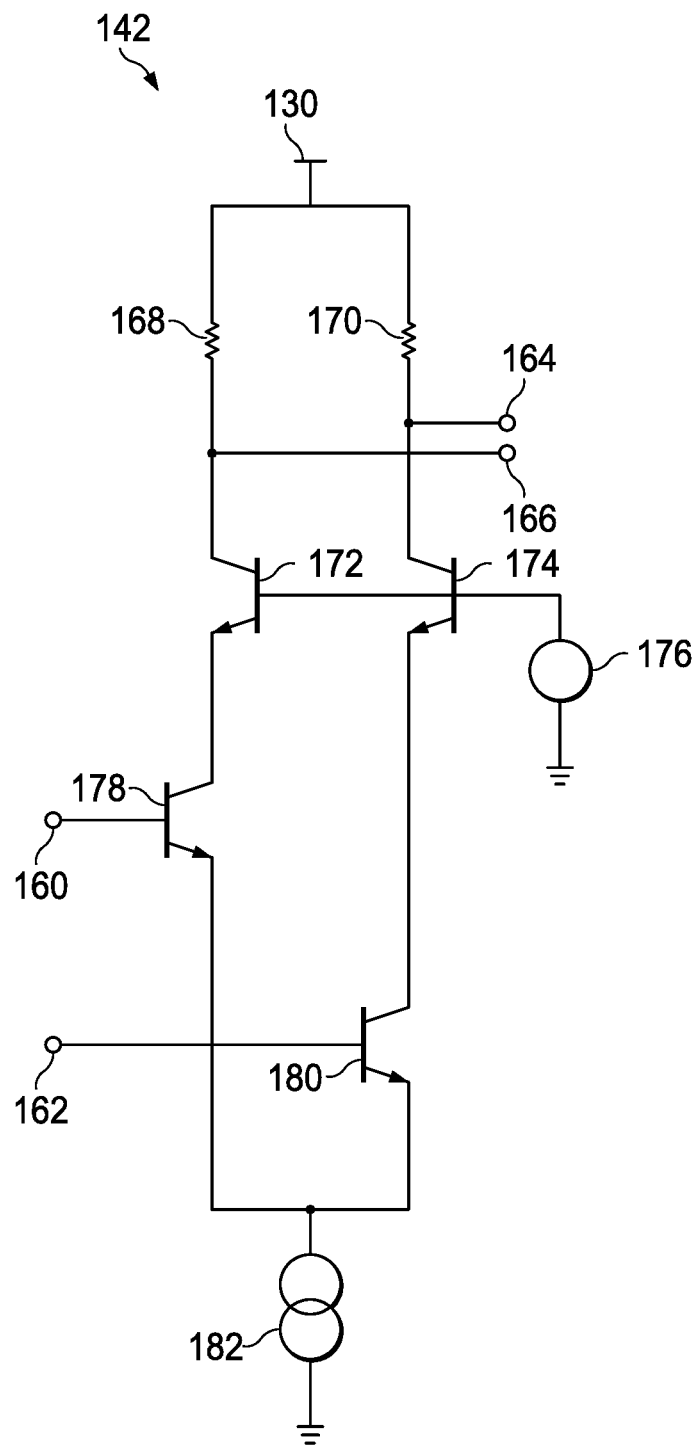
FIG. 6 is a schematic illustration of a limiting amplifier that may be included in the swinging stage of FIG. 4, in accordance with various embodiments.

The limiting amplifier 142 may take any suitable form. For example, FIG. 6 is a schematic illustration of a limiting amplifier 142 that may be included in the swinging stage 102 of FIG. 4, in accordance with various embodiments. The limiting amplifier 142 of FIG. 6 may include a transistor 178 whose base is coupled to the first input terminal 160, and a transistor 180 whose base is coupled to the second input terminal 162. A current source 182 may be coupled between ground and the combined emitter terminals of the transistors 178 and 180. A resistor 168 and a transistor 172 are coupled between the transistor 178 and the supply voltage 130, and a resistor 170 and a transistor 174 are coupled between the transistor 180 and the supply voltage 130. The bases of the transistors 172 and 174 may be coupled to a bias voltage 176. The first output terminal 164 may be coupled to the node between the resistor 170 and the collector of the transistor 174, and the second output terminal 166 may be coupled to the node between the resistor 168 and the collector of the transistor 172.

The limiting amplifier 142 of FIG. 6 is a single-stage amplifier that may achieve a gain of approximately 25 dB or greater, which may be sufficient for achieving the benefits of the cascode switching described above with reference to the cascode circuit 114. The amount of gain necessary may depend on the particular components included in the envelope detector 100; for example, higher gain may be needed in CMOS implementations of the envelope detector 100 to achieve complete switching. The single-stage amplifier of FIG. 6 may have a desirable frequency response for high-frequency applications. In some embodiments, a high-frequency range may be 1-2 GHz. In lower-frequency applications, such as audio processing applications, a higher-gain limiting amplifier 142 (e.g., a chopper amplifier) may be used. In some embodiments, a low-frequency range may be less than 100 MHz. For example, in other embodiments, the limiting amplifier 142 included in a swinging stage 102 may be a multistage amplifier, as known in the art.

The input impedance presented by the envelope detectors 100 may be a function of the bias current. For example, in the embodiment of FIG. 5, the input impedance may be determined by the expression $$\beta/(g_{m1}+g_{m2})$$

where β is the current gain, and $g_{m1}$ and $g_{m2}$ are the transconductances of the core circuit 112 and the limiting amplifier 142, respectively. The value of $g_m$ for a particular stage may be proportional to the bias current in that stage, and the bias current in that stage may be chosen with a desired bandwidth of mind, as known in the art. In some embodiments, a small external series resistance (e.g., 100Ω, depending on the application) coupled to the base of the transistors 116 and 118 may help negate the capacitive loading effects of input devices on the envelope detector 100.

The bandwidth of the envelope detectors 100 disclosed herein may be a function of supply current. In some embodiments in which the transistors are BJTs, various ones of the envelope detectors 100 (e.g., the envelope detector 100 of FIG. 5) may achieve a bandwidth in excess of 2 GHz. For example, a bandwidth of approximately 2.5 GHz may be achieved using a supply current of less than 3 mA at a 3.3 V supply voltage 130. Such bandwidth may be suitable for baseband and intermediate frequency (IF) detection applications (e.g., at 70 and 140 MHz for many applications). In some narrowband applications, a small bias current may be used in the envelope detector 100 to reduce power consumption; in some wideband applications, a large bias current may be used to increase the bandwidth of the detector.

The measurement range of the envelope detectors 100 disclosed herein may be a function of the smallest signal that the envelope detector 100 can measure (referred to as "sensitivity") and the largest signal that the envelope detector 100 can measure (without clipping). In some implementations of the envelope detector 100 of FIG. 5, for example, signals as small as approximately 15 mV peak to peak may be measured with +/−1 dB accuracy (equivalent to −35.5 dBm in a 100Ω differential impedance), and when working with a 3.3 V supply voltage 130, signals as large as 3 V peak to peak may be measured with +/−1 dB accuracy (equivalent to 10.5 dBm in a 100Ω differential impedance). The measurement range of this example is thus approximately 46 dB.

The feedback topology of the envelope detectors 100 disclosed herein may enable the envelope detectors 100 to maintain their accuracy over temperature changes. In particular, as long as there is adequate loop gain, the signal fed back to the swinging stage 102 through the feedback circuit 104 will track the input signal irrespective of the temperature. For example, in some embodiments, an accuracy of +/−0.25 dB may be readily achieved.

The power consumption of the envelope detectors 100 disclosed herein may depend on the bias current (which, as discussed above, may be related to the desired bandwidth of the envelope detector 100). In some embodiments, the core circuit 112 may be biased with 1 mA of current or less. When the swinging stage 102 includes a cascode circuit 114, the limiting amplifier 142 may consume a similar amount of current as the core circuit 112. Various implementations of the envelope detector 100 of FIG. 5 may consume a supply current of less than 3 mA when the supply voltage 130 is held at 3.3 V.

Figure 7:
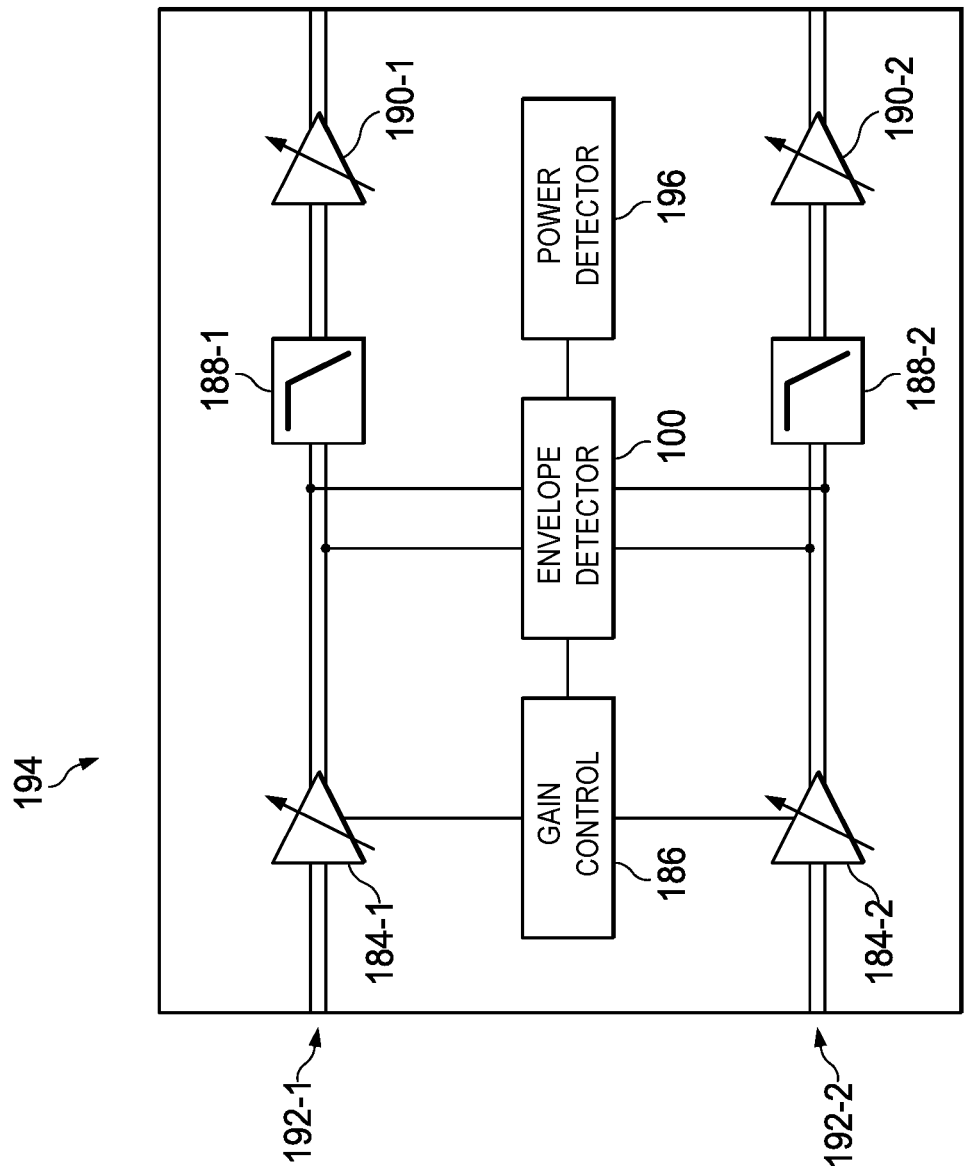
FIG. 7 is a block diagram of a multipath variable gain amplifier including the envelope detector of FIG. 1, in accordance with various embodiments.

The envelope detectors 100 disclosed herein may be used in any suitable device or application. For example, FIG. 7 is a block diagram of a multipath variable gain amplifier (VGA) 194 including an envelope detector 100, in accordance with any of the embodiments disclosed herein. The multipath VGA 194 may include two signal chains 192-1 and 192-2. In some embodiments, the signal chains 192 of the multipath VGA 194 may be used for in-phase (I) and quadrature (Q) components of a modulated signal, as known in the art. Each of the signal chains 192 may include a variable gain preamplifier 184, a filter 188, and a variable gain post-amplifier 190. The filter 188 may be, for example, a tunable low-pass filter, or any other filter known in the art. Gain control circuitry 186 included in the multipath VGA 194 may be used to control the gain of the variable gain preamplifiers 184 (and, in some embodiments, the parameters of the filters 188 and the gain of the variable gain post-amplifiers 190). The envelope detector 100 may tap into the signal chains 192 at any desired location. For example, as illustrated in FIG. 7, the envelope detector 100 may tap into the signal chains 192 between the variable gain preamplifiers 184 and the filters 188. In some embodiments, a power detector 196 may receive the output of the envelope detector 100 and may determine a power statistic of the output of the envelope detector 100. Examples of such power statistics may include the root-mean-square value of the output of the envelope detector 100, a peak value of the output of the envelope detector 100, or any other statistic of the output of the envelope detector 100. The multipath VGA 194 FIG. 7 may be included in any suitable device, such as wireless communication receivers (e.g., in the interface between the radio frequency signals and an analog-to-digital converter).

Figure 8:
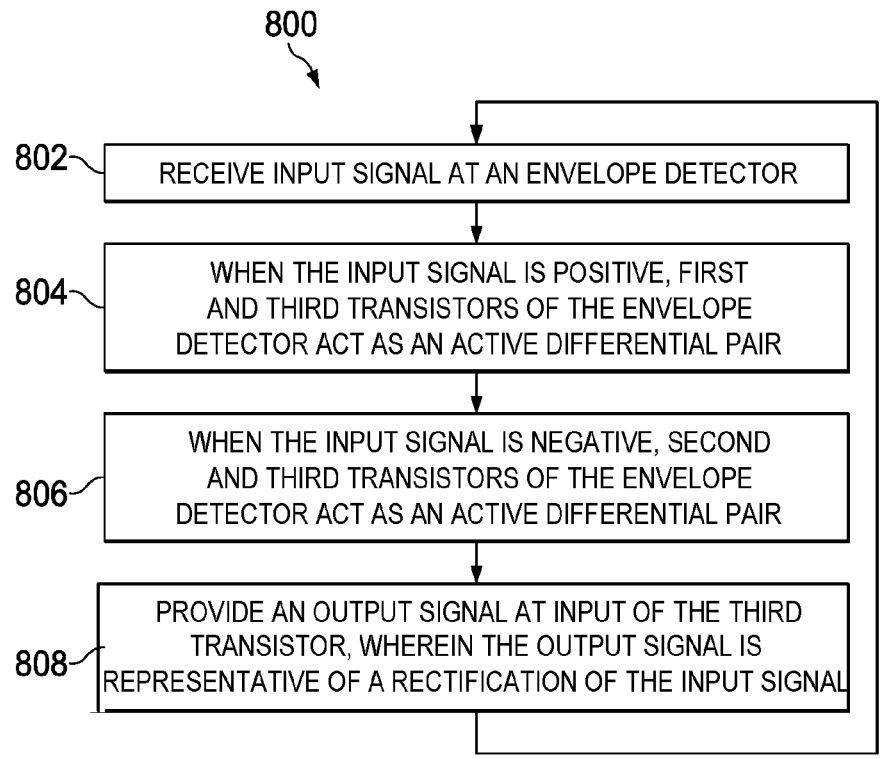
FIG. 8 is a flow diagram of a method of detecting an envelope of an input signal, in accordance with various embodiments.

FIG. 8 is a flow diagram of a method 800 of detecting an envelope of an input signal, in accordance with various embodiments. Operations discussed below with reference to the method 800 may be illustrated with reference to the envelope detector 100 of FIG. 1, but this is simply for ease of discussion, and the method 800 may be used to operate any suitable envelope detection circuitry.

At 802, an input signal may be received at an envelope detector. For example, a differential input signal may be received at the positive input terminal 106 and the negative input terminal 108 of the envelope detector 100.

At 804, first and third transistors of the envelope detector may act as an active differential pair when the input signal (received at 802) is positive. For example, when the voltage at the positive input terminal 106 is greater than the voltage at the negative input terminal 108, the transistors 116 and 120 of the swinging stage 102 may act as an active differential pair.

At 806, second and third transistors of the envelope detector may act as an active differential pair when the input signal (received at 802) is negative. For example, when the voltage at the negative input terminal 108 is greater than the voltage at the positive input terminal 106, the transistors 118 and 120 of the swinging stage 102 may act as an active differential pair.

At 808, an output signal may be provided at the input of the third transistor, wherein the output signal is representative of a rectification of the input signal. For example, an output signal may be provided at the output terminal 110 coupled to the third transistor 120, wherein the output signal is representative of a rectification of the input signal provided to the positive input terminal 106 and the negative input terminal 108.

Figure 9:
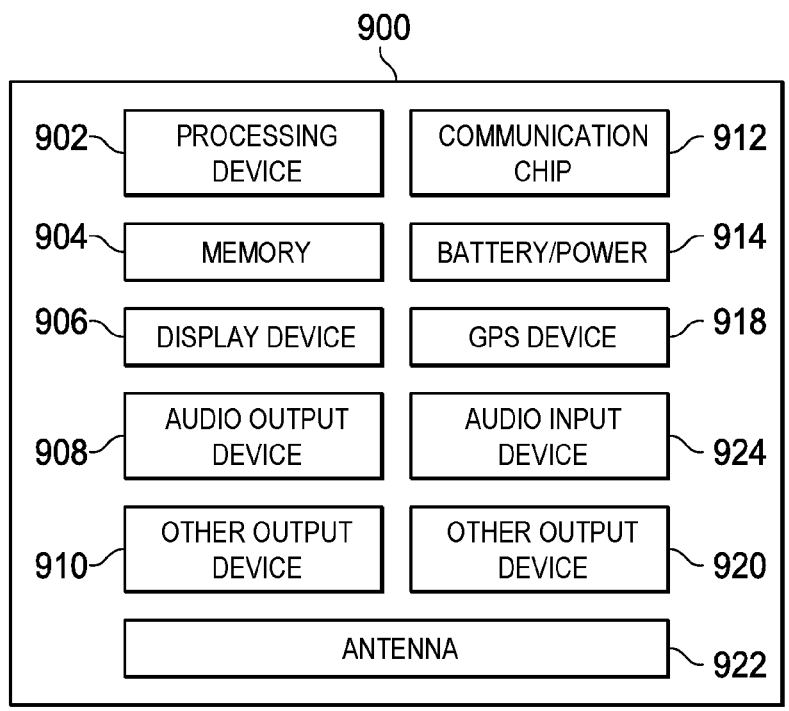
FIG. 9 is a block diagram of a computing device that may include the envelope detector of FIG. 1, in accordance with various embodiments.

Any embodiment of the envelope detector 100 may be implemented as an independent circuit, or may be included in a multifunction chip. More generally, the embodiments disclosed herein may be included in any suitable device, such as any suitable computing device. Applications that may particularly benefit from the envelope detectors 100 disclosed herein may include audio input, audio output, display, and communications applications, or any setting in which analog control is to be performed. FIG. 9 is a block diagram of a computing device that may include any of the embodiments of the envelope detector 100 of FIG. 1, in accordance with the teachings of the present disclosure. In particular, any of the components of the computing device 900 that may benefit from envelope detection may advantageously include the envelope detector 100. A number of components are illustrated in FIG. 9 as included in the computing device 900, but any one or more of these components may be omitted or duplicated, as suitable for the application. In some embodiments, some or all of these components are fabricated onto a single system-on-a-chip (SoC) die.

Additionally, in various embodiments, the computing device 900 may not include one or more of the components illustrated in FIG. 9, but the computing device 900 may include interface circuitry for coupling to the one or more components. For example, the computing device 900 may not include a display device 906, but may include display device interface circuitry (e.g., a connector and driver circuitry) to which a display device 906 may be coupled. In another set of examples, the computing device 900 may not include an audio input device 924 or an audio output device 908, but may include audio input or output device interface circuitry (e.g., connectors and supporting circuitry) to which an audio input device 924 or audio output device 908 may be coupled. Any one or more of the components of the computing device 900 may include one or more envelope detectors 100.

The computing device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some embodiments, the processing device 902 may include an envelope detector 100. The computing device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 904 may include memory that shares a die with the processing device 902. This memory may be used as cache memory and may include embedded DRAM (eDRAM) or spin transfer torque magnetic RAM (STT-MRAM).

In some embodiments, the computing device 900 may include a communication chip 912 (e.g., one or more communication chips). For example, the communication chip 912 may be configured for managing wireless communications for the transfer of data to and from the computing device 900. The term "wireless" and its derivatives may be used to describe circuits, devices, systems, methods, techniques, communication channels, etc., that may communicate data through the use of modulated electromagnetic radiation through a nonsolid medium. The term does not imply that the associated devices do not contain any wires, although in some embodiments they might not. The communication chip 912 may include an envelope detector 100.

The communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 912 may operate in accordance with other wireless protocols in other embodiments. The computing device 900 may include an antenna 922 to facilitate wireless communications and/or to receive other wireless communications (such as AM or FM radio transmissions).

In some embodiments, the communication chip 912 may manage wired communications, such as electrical, optical, or any other suitable communication protocols (e.g., the Ethernet). As noted above, the communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as a global positioning system (GPS), EDGE, GPRS, CDMA, WiMAX, LTE, EV-DO, or others. In some embodiments, a first communication chip 912 may be dedicated to wireless communications, and a second communication chip 912 may be dedicated to wired communications.

The computing device 900 may include battery/power circuitry 914. The battery/power circuitry 914 may include one or more energy storage devices (e.g., batteries or capacitors) and/or circuitry for coupling components of the computing device 900 to an energy source separate from the computing device 900 (e.g., AC line power). The battery/power circuitry 914 may include an envelope detector 100.

The computing device 900 may include a display device 906 (or corresponding interface circuitry, as discussed above). The display device 906 may include any visual indicators, such as a heads-up display, a computer monitor, a projector, a touchscreen display, a liquid crystal display (LCD), a light-emitting diode display, or a flat panel display, for example.

The computing device 900 may include an audio output device 908 (or corresponding interface circuitry, as discussed above). The audio output device 908 may include any device that generates an audible indicator, such as speakers, headsets, or earbuds, for example.

The computing device 900 may include an audio input device 924 (or corresponding interface circuitry, as discussed above). The audio input device 924 may include any device that generates a signal representative of a sound, such as microphones, microphone arrays, or digital instruments (e.g., instruments having a musical instrument digital interface (MIDI) output).

The computing device 900 may include a global positioning system (GPS) device 918 (or corresponding interface circuitry, as discussed above). The GPS device 918 may be in communication with a satellite-based system and may receive a location of the computing device 900, as known in the art. The GPS device 918 may include an envelope detector 100.

The computing device 900 may include an other output device 910 (or corresponding interface circuitry, as discussed above). Examples of the other output device 910 may include an audio codec, a video codec, a printer, a wired or wireless transmitter for providing information to other devices, or an additional storage device.

The computing device 900 may include an other input device 920 (or corresponding interface circuitry, as discussed above). Examples of the other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 900 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 900 may be any other electronic device that processes data.

The following paragraphs provide various examples of the embodiments disclosed herein.

Example 1 is an envelope detector with high input impedance, including: a swinging stage including first, second, and third transistors, wherein the third transistor and an active transistor are arranged as a differential pair, the first transistor is the active transistor when an input to the envelope detector is positive, and the second transistor is the active transistor when the input to the envelope detector is negative; and a feedback circuit, coupled to the swinging stage, to provide an output representative of a rectification of the input.

Example 2 may include the subject matter of Example 1, and may further specify that the feedback circuit comprises a current mirror and a buffer.

Example 3 may include the subject matter of Example 2, and may further specify that the buffer includes an emitter-follower transistor.

Example 4 may include the subject matter of Example 3, and may further specify that the buffer further includes a compensation capacitor.

Example 5 may include the subject matter of any of Examples 3-4, and may further specify that a first branch of the current mirror receives current from the first and second transistors, and a second branch of the current mirror is coupled to the buffer.

Example 6 may include the subject matter of any of Examples 2-5, and may further specify that a first branch of the current mirror receives current from the first and second transistors, and a second branch of the current mirror receives current from the third transistor.

Example 7 may include the subject matter of any of Examples 2-6, and may further specify that the buffer is coupled to the third transistor.

Example 8 may include the subject matter of any of Examples 1-7, and may further specify that the first, second, and third transistors are arranged in a common emitter configuration.

Example 9 may include the subject matter of any of Examples 1-8, and may further specify that the input is a differential input, and the envelope detector further includes: a positive input terminal coupled to the first transistor; and a negative input terminal coupled to the second transistor.

Example 10 may include the subject matter of any of Examples 1-9, and may further specify that a collector of the first transistor is directly coupled to a collector of the second transistor.

Example 11 may include the subject matter of any of Examples 1-10, and may further include an output terminal coupled to the third transistor.

Example 12 may include the subject matter of any of Examples 1-11, and may further specify that the swinging stage includes a core circuit and a cascode circuit.

Example 13 may include the subject matter of Example 12, and may further specify that the cascode circuit includes first and second cascode transistors coupled to the first transistor, and third and fourth cascode transistors coupled to the second transistor.

Example 14 may include the subject matter of Example 13, and may further specify that the cascode circuit includes a diode-connected transistor coupled between (1) a supply voltage and (2) the first and fourth cascode transistors.

Example 15 may include the subject matter of any of Examples 12-14, and may further specify that the cascode circuit includes a limiting amplifier.

Example 16 may include the subject matter of Example 15, and may further specify that: the input is a differential input including positive and negative inputs; the cascode circuit includes first and second cascode transistors coupled to the first transistor, and third and fourth cascode transistors coupled to the second transistor; and the limiting amplifier is to receive the positive and negative inputs, generate amplified positive and negative inputs, provide the amplified positive input to the second and fourth cascode transistors, and provide the amplified negative input to the first and third cascode transistors.

Example 17 may include the subject matter of any of Examples 15-16, and may further specify that the limiting amplifier includes a resistively loaded cascode amplifier.

Example 18 may include the subject matter of any of Examples 15-17, and may further specify that the limiting amplifier includes a chopper amplifier.

Example 19 may include the subject matter of any of Examples 15-18, and may further specify that the limiting amplifier includes a multistage amplifier.

Example 20 may include the subject matter of any of Examples 1-19, and may further specify that the first, second, and third transistors are bipolar junction transistors.

Example 21 may include the subject matter of any of Examples 1-19, and may further specify that the first, second, and third transistors are complementary metal oxide semiconductor transistors.

Example 22 is an envelope detection system, including: an envelope detector, coupled to a point along a signal chain, including a swinging stage, wherein the swinging stage includes first, second, and third transistors, the third transistor and an active transistor are arranged as a differential pair, the first transistor is the active transistor when an input to the envelope detector is positive, and the second transistor is the active transistor when the input to the envelope detector is negative; and a variable gain amplifier in the signal chain and arranged before or after the point in the signal chain.

Example 23 may include the subject matter of Example 22, and may further include a filter in the signal chain.

Example 24 may include the subject matter of any of Examples 22-23, and may further include a power detector circuit to receive an output of the envelope detector.

Example 25 may include the subject matter of Example 24, and may further specify that the power detector circuit is to measure a root-mean-square or peak value of the output of the envelope detector.

Example 26 is a method of detecting an envelope of an input signal, including: receiving an input signal at an envelope detector, wherein, when the input signal is positive, a first transistor and a third transistor in the envelope detector act as an active differential pair, and when the input signal is negative, a second transistor and the third transistor in the envelope detector act as an active differential pair; and providing an output signal at an input of the third transistor, wherein the output signal represents a rectification of the input signal.

Example 27 may include the subject matter of Example 26, and may further specify that the input signal is a differential input signal including a positive input signal and a negative input signal, the positive input signal is provided to the first transistor, and the negative input signal is provided to the second transistor.

Example 28 may include the subject matter of any of Examples 26-27, and may further specify that the envelope detector further includes a plurality of cascode transistors between (1) a current mirror and (2) the first and second transistors.

Example 29 may include the subject matter of Example 28, and may further specify that the envelope detector further includes a replica current mirror branch.

Example 30 may include the subject matter of any of Examples 26-29, and may further include determining a power statistic of the output signal.

What is claimed is:

1. An envelope detector with high input impedance, comprising:
   a swinging stage including first, second, and third transistors, wherein the third transistor and an active transistor are arranged as a differential pair, the first transistor is the active transistor when an input to the envelope detector is positive, and the second transistor is the active transistor when the input to the envelope detector is negative; and
   a feedback circuit, coupled to the swinging stage, to provide an output representative of a rectification of the input.

2. The envelope detector of claim 1, wherein the feedback circuit comprises a current mirror and a buffer.

3. The envelope detector of claim 2, wherein the buffer comprises an emitter-follower transistor.

4. The envelope detector of claim 2, wherein the buffer is coupled to the third transistor.

5. The envelope detector of claim 1, wherein the first, second, and third transistors are arranged in a common emitter configuration.

6. The envelope detector of claim 1, wherein the input is a differential input, and the envelope detector further comprises:
   a positive input terminal coupled to the first transistor; and
   a negative input terminal coupled to the second transistor.

7. The envelope detector of claim 1, wherein a collector of the first transistor is directly coupled to a collector of the second transistor.

8. The envelope detector of claim 1, wherein the swinging stage includes a core circuit and a cascode circuit.

9. The envelope detector of claim 8, wherein the cascode circuit includes first and second cascode transistors coupled to the first transistor, and third and fourth cascode transistors coupled to the second transistor.

10. The envelope detector of claim 9, wherein the cascode circuit includes a diode-connected transistor coupled between (1) a supply voltage and (2) the first and fourth cascode transistors.

11. The envelope detector of claim 8, wherein the cascode circuit includes a limiting amplifier.

12. The envelope detector of claim 11, wherein:
    the input is a differential input including positive and negative inputs;
    the cascode circuit includes first and second cascode transistors coupled to the first transistor, and third and fourth cascode transistors coupled to the second transistor; and
    the limiting amplifier is to receive the positive and negative inputs, generate amplified positive and negative inputs, provide the amplified positive input to the second and fourth cascode transistors, and provide the amplified negative input to the first and third cascode transistors.

13. The envelope detector of claim 11, wherein the limiting amplifier includes a resistively loaded cascode amplifier.

14. The envelope detector of claim 1, wherein the first, second, and third transistors are bipolar junction transistors.

15. The envelope detector of claim 1, wherein the first, second, and third transistors are complementary metal oxide semiconductor transistors.

16. An envelope detection system, comprising:
    an envelope detector, coupled to a point along a signal chain, including a swinging stage,
    wherein the swinging stage includes first, second, and third transistors, the third transistor and an active transistor are arranged as a differential pair, the first transistor is the active transistor when an input to the envelope detector is positive, and the second transistor is the active transistor when the input to the envelope detector is negative; and
    a variable gain amplifier in the signal chain and arranged before or after the point in the signal chain.

17. The envelope detection system of claim 16, further comprising:
    a filter in the signal chain.

18. The envelope detection system of claim 16, further comprising:
    a power detector circuit to receive an output of the envelope detector.

19. A method of detecting an envelope of an input signal, comprising:
    receiving an input signal at an envelope detector, wherein:
    when the input signal is positive, a first transistor and a third transistor in the envelope detector act as an active differential pair, and when the input signal is negative, a second transistor and the third transistor in the envelope detector act as an active differential pair; and providing an output signal at an input of the third transistor, wherein the output signal represents a rectification of the input signal.

20. The method of claim 19, further comprising:
determining a power statistic of the output signal.

* * * * *